United States Patent [19]
Stephens et al.

[11] Patent Number: 5,134,638
[45] Date of Patent: Jul. 28, 1992

[54] SHIFT REGISTER CONNECTION BETWEEN ELECTRICAL CIRCUITS

[75] Inventors: David V. Stephens, Pershore; Christopher M. Thomas, Cheltenham; James C. Green, Tewkesbury; David J. Vallins, Cheltenham, all of England

[73] Assignee: Smiths Industries Public Limited Company, London, Great Britain

[21] Appl. No.: 678,458

[22] Filed: Apr. 1, 1991

[30] Foreign Application Priority Data

Apr. 17, 1990 [GB] United Kingdom ............ 9008544

[51] Int. Cl.⁵ .......................................... G01R 31/28
[52] U.S. Cl. ........................................ 377/54; 377/64; 371/22.1; 371/22.6
[58] Field of Search ............ 377/54, 64; 371/22.1, 371/22.6; 324/74

[56] References Cited

U.S. PATENT DOCUMENTS

| | | | |
|---|---|---|---|
| 3,566,097 | 2/1971 | Hildebrandt | 377/54 |
| 3,764,782 | 10/1973 | Spauszus et al. | 377/54 |
| 3,849,634 | 11/1974 | Saltini et al. | 377/54 |
| 3,973,108 | 8/1976 | Hogg | 377/54 |
| 3,974,457 | 8/1976 | Bates et al. | 377/54 |
| 4,433,426 | 2/1984 | Förster | 377/54 |
| 4,639,557 | 1/1987 | Butler | |
| 4,811,344 | 3/1989 | Chaurel et al. | 371/22.1 |
| 4,825,439 | 4/1989 | Sakashita et al. | 377/54 |
| 4,961,191 | 10/1990 | Nakagawa et al. | 371/22.1 |

FOREIGN PATENT DOCUMENTS

| | | |
|---|---|---|
| 3801223 | 7/1988 | Fed. Rep. of Germany . |
| 3836812 | 5/1989 | Fed. Rep. of Germany . |
| 2175097 | 11/1986 | United Kingdom . |

*Primary Examiner*—Stanley D. Miller
*Assistant Examiner*—Scott A. Ouellette
*Attorney, Agent, or Firm*—Pollock, VandeSande and Priddy

[57] ABSTRACT

An electrical assembly including a digital logic circuit, an analogue processing circuit and an analogue power circuit is connected to test equipment. Test data from the equipment is supplied to the circuits via a shift register divided into three serial portions. One portion is connected between the digital circuit and the processing circuit, another portion is connected between the processing circuit and the power circuit, the final portion being connected at the output of the power circuit. The portions can isolate the circuits from each other and supply test data to the circuit under test. The test data output from the circuit is clocked along the register to its output.

12 Claims, 2 Drawing Sheets

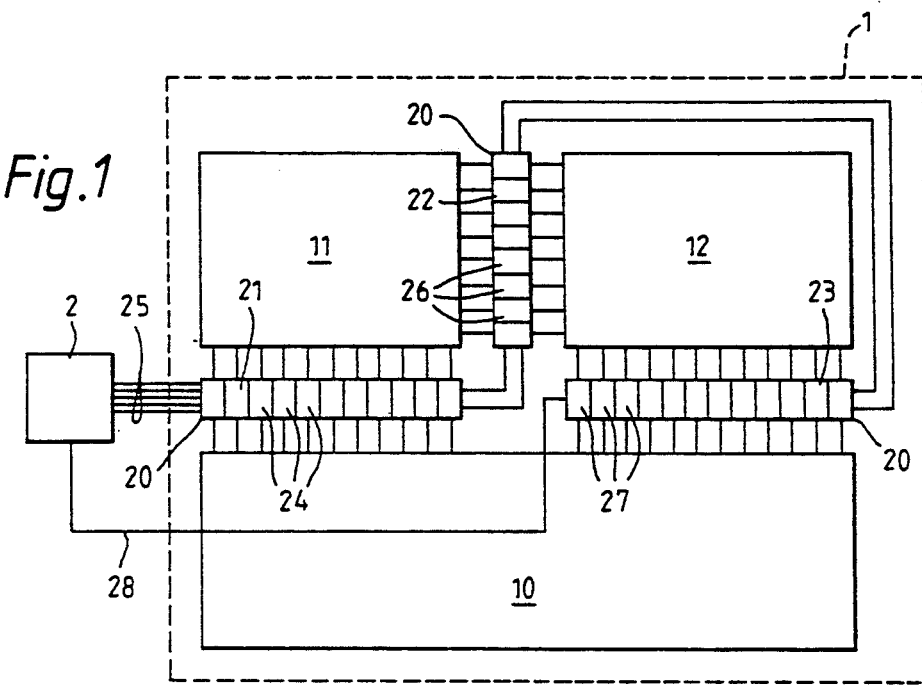
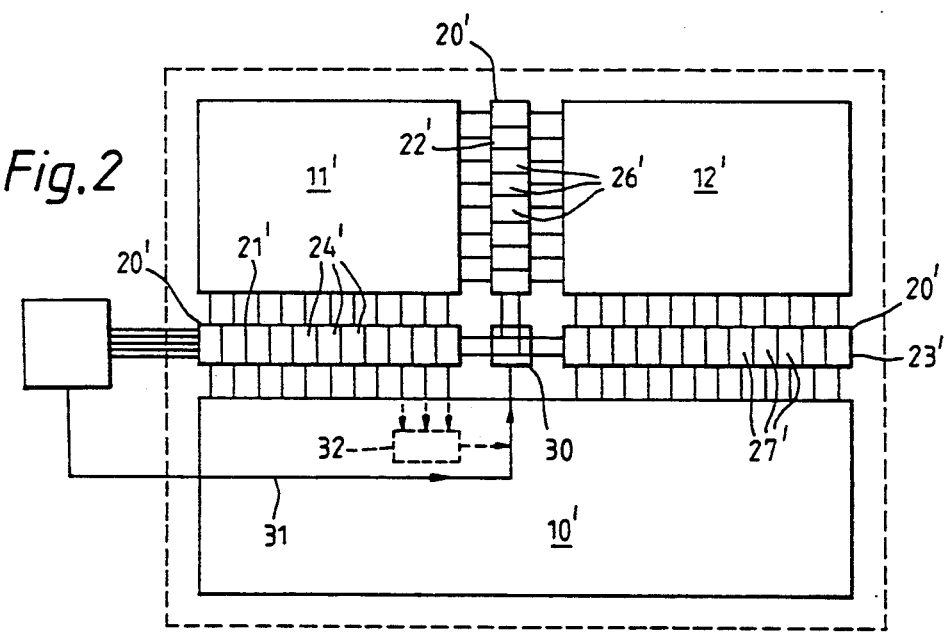

SHIFT REGISTER CONNECTION BETWEEN ELECTRICAL CIRCUITS

BACKGROUND OF THE INVENTION

This invention relates to electrical assemblies.

Many electrical assemblies include several electrical circuits of different kinds formed on a single integrated circuit or printed circuit board. The assemblies may, for example, include a mixture of analogue and digital circuits, or different types of analogue circuit such as signal processing circuits and power circuits. These mixed technology assemblies present various difficulties in design and testing. Circuits employing different technologies are preferably designed independently by engineers specializing in the particular technology. This can, however, lead to problems in ensuring that the circuits function together in the desired manner. To reduce this risk, an engineer working in one technology often has to monitor the work of an engineer working in a different technology to ensure compatibility but with a consequent increase in development time and costs. Testing completed assemblies also causes difficulties. Commonly, different test equipment is needed to test the different circuits and it is also often necessary to isolate the different circuits from one another to ensure that the testing is not influenced by the other circuits and that the testing of one circuit does not damage the other circuits.

SUMMARY OF THE INVENTION

It is an object of the present invention to provide an electrical assembly which can be used to alleviate these difficulties.

According to one aspect of the present invention there is provided an electrical assembly including first and second electrical circuits interconnected with one another by a plurality of respective connections to individual cells of shift register means, means for addressing the shift register means to cause the shift register to shift and to direct the flow of data within the shift register, and means to isolate the first circuit from the second circuit at the shift register means such that data can be supplied to only one of the circuits.

The shift register means may be selectively operable to supply data to either the first circuit or the second circuit. At least one of the cells of the shift register means is preferably arranged to effect a voltage shift to signals supplied between the first and second circuits via the shift register. The assembly may include a third electrical circuit, the shift register means having two portions a first of which interconnects the first and second circuits and the second of which interconnects the second and third circuits. The first portion of the shift register means may be operable to supply data to either the first or second circuit and the second portion of the shift register means be operable to supply data to the third circuit. The three circuits may comprise a digital logic circuit, an analogue processing circuit and an analogue power circuit. The shift register means may have a third portion connected at the output of the third circuit. The three portions of the shift register means may be connected together serially. Data output from the electrical circuits is preferably supplied to the shift register means and is clocked along the shift register means. The shift register means may include three portions branched together at a gate, each portion of the shift register means being connected to a respective circuit. The shift register means may include a plurality of groups of portions branched together. The electrical circuits and shift register means may be formed on a single integrated circuit substrate.

Several different electrical assemblies, in accordance with the present invention, will now be described, by way of example, with reference to the following drawings.

DESCRIPTION OF THE DRAWINGS

FIGS. 1 to 4 are respectively schematic views of four different assemblies.

DESCRIPTION OF THE PREFERRED EMBODIMENTS

Figure 3:
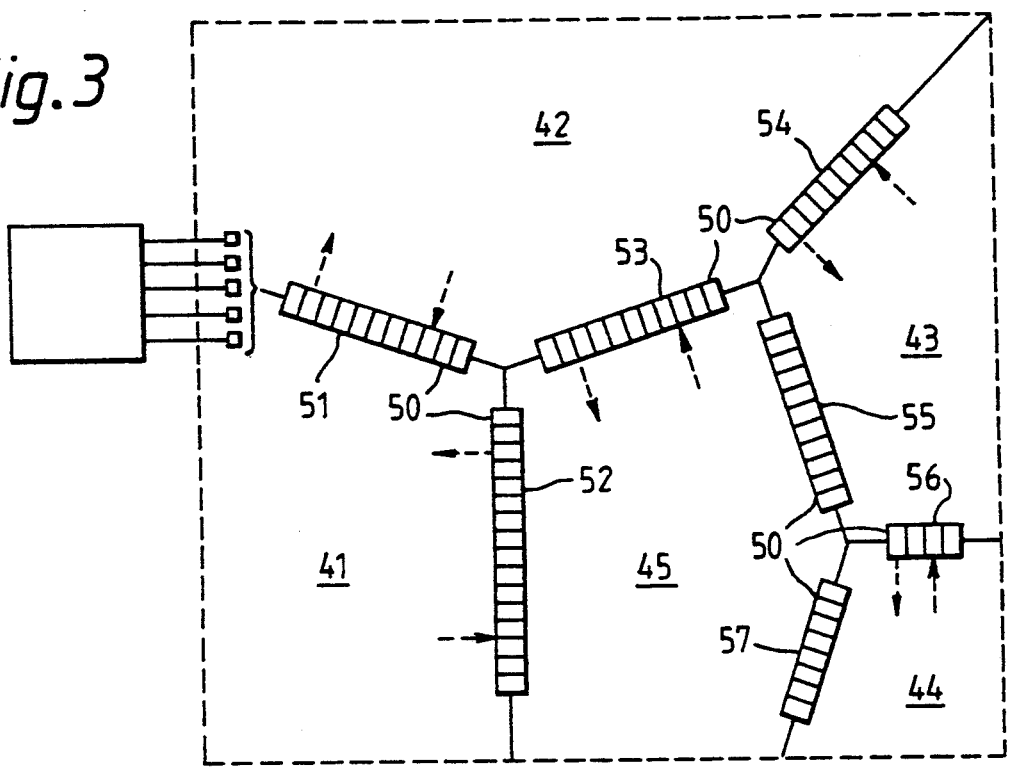

With reference to FIG. 1, there is shown an electrical assembly 1 connected with test equipment 2.

The electrical assembly 1 comprises a digital logic circuit 10 which is connected to an analogue signal processing circuit 11 which is in turn connected to an analogue power circuit 12. The assembly 1 also includes a shift register 20 which is divided into three serially connected nodes or portions 21, 22 and 23. The first portion 21 is shown as having eleven cells 24, although any number could be employed according to the nature of the circuits to which it is connected. This portion 21 of the shift register 20 is connected between the digital logic circuit 10 and the analogue signal processing circuit 11, eleven different, parallel interconnections being made between the two circuits via respective ones of the cells 24. The cells 24 are arranged to provide a voltage level shifting facility so that signals output from one of the circuits 10 or 11 at its operating voltage are changed (either increased or decreased) to the operating voltage of the other circuit. In normal operation of the assembly 1, signals pass freely between the two circuits 10 and 11 via the first portion 21 of the shift register. The first portion 21 of the shift register 20 has its input lines 25 connected to the test equipment 2 by which the shift register is addressed and by which test data and shift register control signals (clock, up/down, enable and reset) can be supplied to the shift register, in the manner described later.

The second portion 22 of the shift register 20 is shown having eight individual cells 26 and is connected between the processing circuit 11 and the analogue power circuit 12. Eight different, parallel interconnections are made between the two circuits 11 and 12 via respective ones of the cells 26. The cells 26 adjust the voltage level between input and output signals in the same way as in the first portion 21 and, in normal operation, allow for free flow of signals between the two circuits 11 and 12. The input of the second portion 22 receives the output of the first portion 21, whereas the output of the second portion 22 is connected to the input of the third portion 23.

The third portion 23 of the shift register 20 is shown having twelve cells 27 which are each connected via respective individual connections to the power circuit 12 only.

In normal operation, as explained above, the first two portions 21 and 22 of the shift register enable communication between the digital logic circuit 10 and the signal processing circuit 11, and between the signal processing circuit 11 and the power circuit 12 while providing voltage level shifting functions. The third portion 23 of the shift register 20 serves no function during normal operation.

When it is desired to test either one of the circuits 10, 11 or 12, the test equipment 2 provides signals on line 25 to isolate that circuit from the other circuits. For example, if testing of the signal processing circuit 11 was to be carried out, the signals from the test equipment 2 would isolate the signal processing circuit from both the logic circuit 10 and the power circuit 12 by preventing passage of signals through the cells 24 of the first portion 21 and through the cells 26 of the second portion 22. Test data, in the form of a pattern of ones and zeros is then supplied by the equipment 2 and shifted along the shift register 20, through the first portion 21 and into the first part of the second portion 22. The test equipment 2 thereby directs the flow of data within the shift register. The test data is output from the respective cells 26 in the first part of the second portion 22 to the circuit 11. The response that this test data produces is output from the circuit 11 into the second part of the second portion 22 where it is clocked further along the shift register 20 into the third portion 23. The response data is output from the third portion 23 to the test equipment by a data line 28.

If it were, instead, necessary to test the digital logic circuit 10, the test data and its response would be supplied to and from the logic circuit via the first portion 21 of the shift register. Testing of the power circuit 12 is achieved via the third portion 23 of the shift register 20 while the second portion 22 isolates the power circuit from the processing circuit 11.

In this way, different circuits within an assembly can be readily isolated without the need to make mechanical disconnection. Access to different points of the assembly can be made via a single connection point thereby facilitating automated testing. Because the number of connection points to the assembly for testing is reduced compared with assemblies requiring individual connection to different parts of each circuit, this may enable the overall size of the assembly to be reduced. Where the assembly is formed on a single integrated circuit substrate, a reduction in size can considerably reduce the cost of manufacture of the assembly. It is also possible, using the present invention, to test each circuit in the assembly at the same time, without the need to make external reconnection, thereby reducing test time and hence cost of manufacture. The need for the individual circuits within the assembly to be able to interface with the shift register imposes a discipline on the designers of each circuit which ensures that the different circuits will function correctly with each other. This enables the different designers to work independently and can lead to a reduction in development time.

An alternative assembly is shown in FIG. 2, which also includes a digital logic circuit 10′, an analogue signal processing unit 11′, an analogue power circuit 12′ and a shift register 20′. The shift register 20′ differs from the serial register 20 of FIG. 1 in that it has a branched configuration, in which the three portions 21′ to 23′ are connected at a common junction 30. The junction 30 takes the form of a gating element which provides means for directing the flow of data output from portion 21′ to the desired portion 22′ or 23′ The gating element 30 can be controlled either by an external control line 31 or by a code embodied in a leader to the message signals which is decoded by a decoder 32. More particularly, the inputs to portions 22′ and 23′ are both arrangement also differs from that of FIG. 1 in that the third portion 23′ serves the function of interconnecting the digital logic circuit 10′ with the analogue power circuit 12′. The cells 27′ of the third portion 23′ normally allow free passage of signals between the two circuits 10′ and 12′ (with voltage level shifting if need be) but, when testing is desired, the cells are switched to isolate the two circuits.

The invention can be applied to assemblies having any number of different circuits and the output from one portion could be branched into three or more different portions by using a similar external control or a decoder. In FIG. 3, there is shown an assembly having five different circuits 41 to 45. The shift register 50, in this assembly, comprises seven portions 51 to 57 in three groups of portions 51 to 53, 53 to 55 and 55 to 57 which are branched with one another. Gating elements (not shown) are included at each branch point:. These gating elements can be controlled by separate, respective external control lines. Alternatively, the gating elements could be controlled by respective decoders, the codes for successive portions being concatenated together. It would be possible instead to use a single decoder that controls all the different gating elements. The portion 51 of the shift register 50 interconnects circuits 41 and 42 and serves to test circuit 42; portion 52 interconnects circuits 41 and 45 and serves to test circuit 41; portion 53 interconnects circuits 42 and 45 and serves to test circuit 45; portion 54 interconnects circuits 42 and 43 and serves to test circuit 43; portion 55 interconnects circuit 43 and 45; portion 56 interconnects circuits 43 and 44 and serves to test circuit 44; and portion 57 interconnects circuits 44 and 45. It can be seen, therefore, that two of the portions of the shift register 50, namely portions 55 and 57 do not serve any test function, that is, they do not supply test data to or from either of the circuits to which they are connected, although they would be switched during testing so that their respective cells isolate the circuit under test. Where additional test connections are required, it would be possible to employ the connections made at the portions 55 and 57. For example, shift register portion 55 could provide additional test connections to circuit 43, whereas portion 57 could provide additional test connections to circuit 44.

Figure 4:
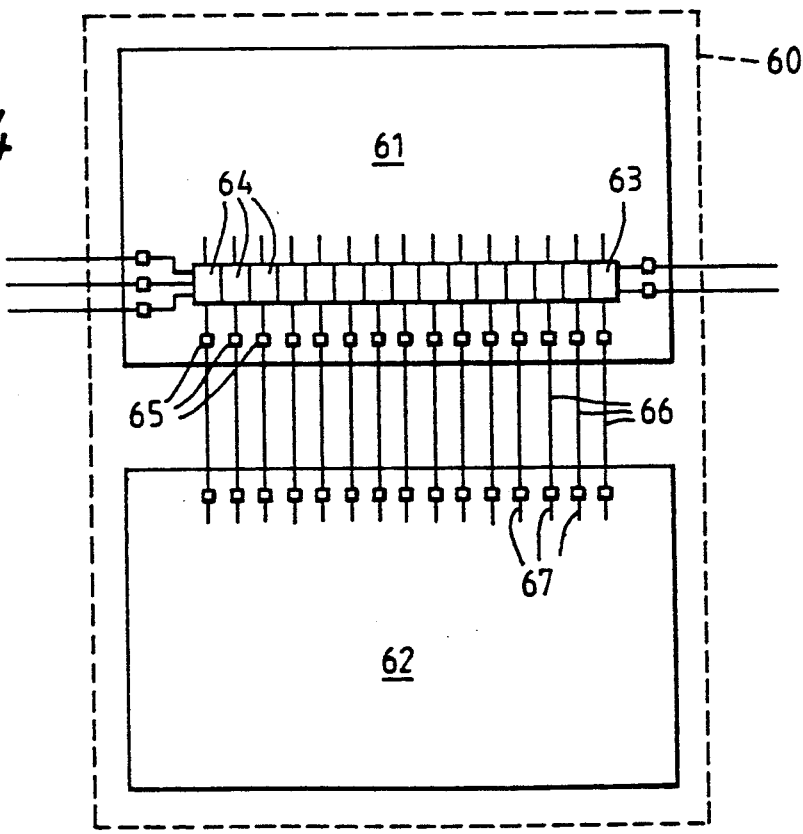

The assembly may be formed on a single integrated circuit substrate with the shift register being formed by integration on the substrate. Alternatively, some or all the circuits of the assembly may be formed on different substrates or chips which may be mounted together on a printed circuit board. An example of such an arrangement is shown in FIG. 4 in which two circuits formed on separate chips 61 and 62 are mounted, such as by soldering, on a printed circuit board 60. The shift register 63 is integrated on one of the circuit chips 61 with each cell 64 being connected between various parts of the chip 61 and a respective one of the output pads 65. The output pads 65 are each connected via respective lines 66 to individual pads 67 on the other chip 62. The shift register 63 is used to isolate the two chips when one is being tested and enables both chips to be tested at a single connection point.

What we claim is:

1. An electrical assembly comprising: first and second electrical circuits; shift register means having a plurality of individual cells, the shift register means being connected to interconnect said first and second circuits with one another by a plurality of respective connections to said cells of the shift register means; and means for addressing the shift register means to cause the shift register means to shift and to direct a flow of data within the shift register means, said addressing means being arranged to isolate said first circuit from said second circuit at the shift register means such that data can be supplied selectively to either the first circuit or the second circuit.

2. An electrical assembly according to claim 1, wherein at least one of the cells of the shift register means effects a voltage shift to signals supplied between the first and second circuits via the shift register means.

3. An electrical assembly according to claim 1, including a third electrical circuit, wherein the shift register means comprises two portions, wherein a first portion interconnects the first and second circuits, and wherein the second portion interconnects the second and third circuits.

4. An electrical assembly according to claim 3, wherein the three circuits comprise a digital logic circuit, an analogue processing circuit and an analogue power circuit.

5. An electrical assembly according to claim 3, wherein the shift register means includes a third portion, and wherein the third portion is connected at the output of the third circuit.

6. An electrical assembly according to claim 5, wherein the three portions of the shift register means are connected together serially.

7. An electrical assembly according to claim 1 wherein said addressing means clocks data output from said electrical circuits along the shift register means.

8. An electrical assembly according to claim 1, wherein the shift register means includes three portions branched together at a gate, and wherein each portion of the shift register means is connected to a respective one of said electrical circuits.

9. An electrical assembly according to claim 1, wherein the assembly includes a single integrated circuit substrate, and wherein the electrical circuits and shift register means are formed on said single integrated circuit substrate.

10. An electrical assembly comprising: an analogue electrical circuit; a digital electrical circuit; shift register means having a plurality of individual cells, the shift register means being connected to interconnect said analogue and digital circuits with one another by a plurality of respective connections to said cells of the shift register means; means for addressing the shift register means such that the shift register means isolates said analogue circuit from said digital circuit and supplies data from the addressing means to and from only one of the said circuits.

11. An electrical assembly comprising: first, second and third electrical circuits; shift register means comprising two portions each having a plurality of individual cells, said first portion being connected to interconnect said first and second circuits with one another by a plurality of respective connections to the cells of the first portion of the shift register means, and said second portion being connected to interconnect said second and third circuits with one another by a plurality of respective connections to the cells of the second portion of the shift register means; and means for addressing said shift register means to cause the shift register means to shift and to direct a flow of data within the shift register means, said addressing means being arranged to isolate one of said circuits from another of said circuits at the shift register means such that data can be supplied to only said one circuit.

12. An electrical assembly comprising: first, second and third electrical circuits; shift register means having three portions branched together at a gate, each of said portions having a plurality of individual cells, said three portions of the shift register means being connected to respective ones of said electrical circuits to interconnect said circuits with one another by a plurality of respective connections to the cells of the shift register means; and means for addressing the shift register means to cause the shift register means to shift and to direct a flow of data within the shift register means, said addressing means being arranged to isolate one of said circuits from another of said circuits at the shift register means such that data can be supplied to only said one circuit.

* * * * *